Oct. 15, 1957 R. W. BRADMILLER 2,810,073

STABLE TRANSISTOR OSCILLATOR

Filed April 29, 1955

INVENTOR.
Richard W. Bradmiller

BY Alden D. Redfield

Attorney

United States Patent Office 2,810,073

Patented Oct. 15, 1957

2,810,073

STABLE TRANSISTOR OSCILLATOR

Richard W. Bradmiller, Cincinnati, Ohio, assignor to Avco Manufacturing Corporation, Cincinnati, Ohio, a corporation of Delaware Application April 29, 1955, Serial No. 504,919

9 Claims. (Cl. 250—36)

The present invention relates generally to electronic oscillators, and more particularly to transistor oscillators which are frequency stable in response to variations of supply voltage and of temperature.

Transistors are unilateral control devices of the semi-conductor type. The transistor is commonly employed because of its amplifying properties, and transistor circuits have been described which are capable of performing many of the functions of vacuum tube circuits, such as detection, amplifications, limiting, frequency conversions, oscillation and the like.

The transistor, in one presently common form, employs a block of semi-conducting crystalline material, such as silicon or germanium, containing certain impurities in accurately measured quantities. The block of semi-conducting material is provided on one of its surfaces with two closely adjacent electrodes, called emitter and collector electrodes, and with a third electrode called a base electrode. The base electrode provides a large area low-resistance contact with one surface of the semi-conductor block, while the remaining electrodes provide small area rectifying contacts. The input circuit of a transistor amplifier is usually connected between the emitter and base electrodes, and the output circuit is usually connected between the collector and base electrodes. Since the base electrode is common to the input and output circuits it may be operated at ground or reference potential, or an impedance may be interposed between the base electrode and ground. In the latter case the impedance is common to the base, emitter and collector circuits.

Transistor oscillators may operate in accordance with two broad principles, i. e. (1) as voltage feedback oscillators, and (2) as current feedback oscillators employing a negative resistance characteristic of the transistor, which is available under certain operating conditions. The latter application is posisble only when utilizing transistors having current amplification greater than unity, and makes possible a number of oscillator circuits which are not analogous to known vacuum tube oscillator circuits.

Transistor oscillators as presently known have relatively poor frequency stability with respect to variations of bias and of temperature. This instability appears to be inherent in transistor circuits because of the variations of carrier mobility which take place in the transistor as operating conditions vary. In order to provide a transistor oscillator which is stable with respect to supply voltage variations, it is therefore necessary to provide effects compensatory to those due to such variations, and these effects may include variations of emitter and/or collector electrode bias in such manner that oscillator frequency remains substantially constant as supply voltage or temperature is varied.

The present invention, briefly described, provides a resistance-diode network between a source of supply voltage for a transistor oscillator and the electrodes of the oscillator, which, when properly adjusted, increases the frequency stability of the oscillator during variations of supply voltage by a factor of twenty times. More specifically, for one typical oscillator circuit employing a type WE 1729 point contact transistor operating at approximately 2 mc./s., it is found that to maintain oscillator frequency constant when supply voltage is varied over a specified range requires that collector voltage $V_c$ be reduced slightly as supply voltage increases. This may be accomplished by connection of a diode circuit between the collector electrode and the positive or emitter supply point of the voltage supply. The diode is operated in its zener breakdown region, i. e. on reverse conduction and as a constant voltage device, and is adjusted to begin conduction at the lowest supply voltage which is expected to be encountered. The diode maintains constant voltage across its terminals as supply voltage increases, so that collector voltage decreases toward zero as more current flows through the diode and a resistance in series therewith.

Temperature compensation effects are similar to voltage compensation effects. As temperature increases, collector voltage tends to decrease because the saturation current at the collector electrode increases. However, the diode circuit tends to maintain collector voltage constant, as current increases.

The type IN 138A silicon junction diode was employed in a practical application of my invention, operating in its "zener discharge region." Other semi-conductor diode types may be employed, provided they exhibit a "zener discharge region"; this may be simulated by one diode or several diodes connected in series and operated in the conducting region of the diode or diodes.

It is, accordingly, an object of the present invention to provide a novel transistor oscillator circuit having excellent supply voltage and temperature stability.

It is another object of the present invention to provide a novel transistor oscillator having a voltage regulator system in circuit with its voltage supply which compensates for variations of voltage supply amplitude and for transistor temperature by compensatory adjustment of transistor electrode voltages.

It is a more specific object of my invention to provide a circuit for compensatorily varying voltage of a transistor electrode in response to variations of supply voltage or of transistor temperature, by means of a semi-conductor diode resistance network, the diode operating in its zener breakdown region.

The above and still further feautres, objects, and advantages of the invention will become apparent upon consideration of the following detailed description of a specific embodiment of the invention, especially when taken in conjunction with the accompanying drawings, wherein.

The matter of "zener breakdown" is discussed in an article by Pearson, in Proceedings of the Institute of Radio Engineers, for March 1952. Essentially, the phenomenon involved is that for a sufficiently great inverse voltage applied to a semi-conductor diode, the diode becomes highly conductive, and maintains a substantially constant voltage across its terminals during variations of current through the diode.

Figure 1:
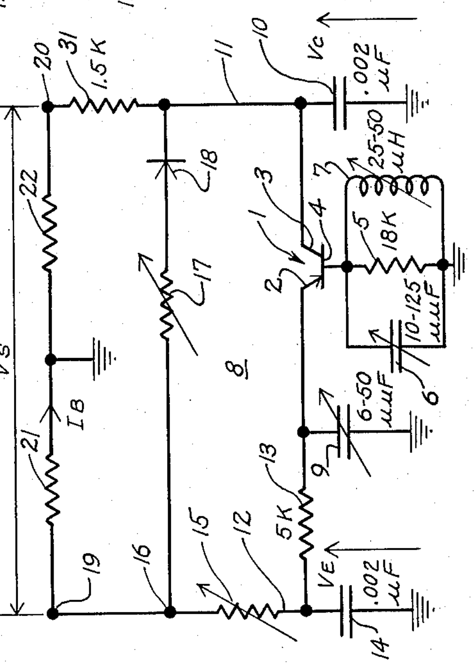
Figure 1 is a schematic circuit diagram of an oscillator in accordance with the invention.

Referring more specifically to Figure 1 of the accompanying drawings, the reference numeral 1 denotes a transistor, having an emitter 2, a collector 3 and a base electrode 4. The base electrode 4 is connected to ground via a resistance 5. In shunt with the resistance 5 are connected a variable condenser 6 and a variable inductance 7, which together establish the resonant frequency of oscillator 8, subject to the relatively slight influence of other circuit parameters and of circuit voltages. The emitter electrode 2 is coupled to ground via a variable condenser 9, and the collector electrode 3 via a fixed by-pass condenser 10. The collector electrode is connected directly to a negative bias lead 11, while the emitter electrode is connected to a positive bias lead 12 via an insulating resistance 13, the lead 12 being in turn connected to ground via a fixed by-pass condenser 14.

A variable resistance 15 is connected in series with the lead 12, and between the high potential terminal 16 of resistance 12 and the lead 11 is connected in series a variable resistance 17 and a semi-conductor diode 18 connected in reverse direction, i. e. with its anode connected to lead 11.

A source of voltage supply (not shown) is connected to terminals 19, 20, terminal 19 being positive, and voltage divider resistances 21, 22 are connected between terminals 19, 20, their junction points being grounded. A resistance 31 is connected between the anode of diode 18 and terminal 20.

In the circuit as illustrated and above described, circuit values in one specific example of the invention were as follows:

| | |
|---|---|
| Diode type | IN 138A (silicon). |
| Transistor type | WE 1729 (Western Electric). |
| Resistances: | |
| **5** | 18K. |
| **13** | 5K. |
| **31** | 1.5K. |
| Condensers: | |
| **6** | 10–125 $\mu\mu$f. |
| **9** | 6–50 $\mu\mu$f. |
| **10, 14** | .002 $\mu$f. |
| Inductor **7** | 25–50 $\mu$h. |

The operating frequency of the oscillator is slightly under two mc./s. The oscillator operates as a negative impedance oscillator, operating conditions for which are described at pages 275–278 of Shea, Principles of Transistor Circuits, published by John Wiley and Sons, Inc., 1953.

Figure 2:
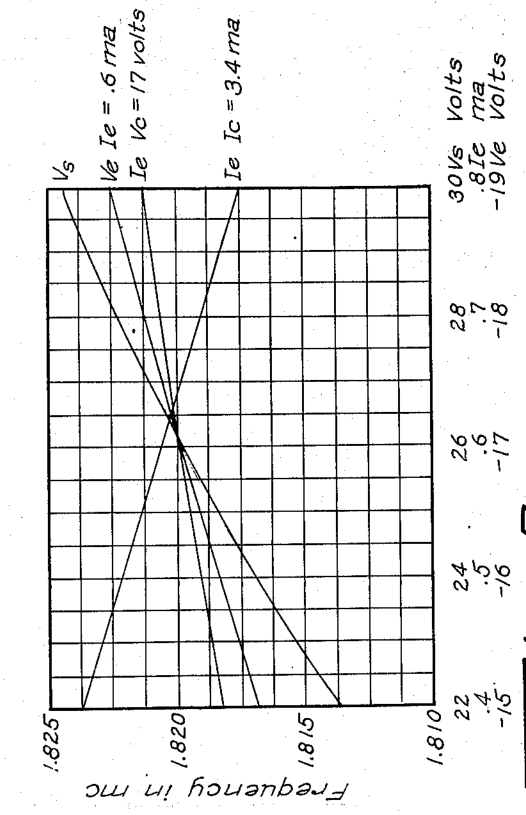
Figure 2 is a graph of oscillator frequency versus various electrode bias voltages and currents, and versus supply voltage.

A plot of variation of oscillator frequency with supply voltage V*s*, emitter voltage V*e* and emitter current I*e* is provided in Figure 2 of the accompanying drawings. This plot indicates that constant frequency may be maintained as supply voltage is varied over the range 22–30 volts, provided the value of V*c* is decreased as V*s* increases, in suitable proportion.

The relative values of resistances 21 and 22 determine the values of emitter and collector voltages, subject to correction for voltage drops in associated resistances. To accomplish a drop in collector voltage V*c* as supply voltage V*s* increases, the diode 18 is operated in its zener breakdown region, so as to begin conduction at the lowest supply voltage expected. As supply voltage increases, the diode 18 maintains constant voltage across its terminals, but its current flow increases. Since this current flow takes place in series with resistance 31 the voltage on lead 11 decreases, and the collector voltage correspondingly decreases. Since the value of diode current may be adjusted by adjusting variable resistance 17, the drop in collector voltage V*c* which accompanies any increase in supply voltage V*s* may be adjusted by adjusting variable resistance 17. The precise setting for R*s* (i. e., resistor 17) which provides optimum frequency regulation as V*s* increases varies with individual transistors, transistor operating points and external circuit components and may be empirically determined for each particular application.

Figure 3:
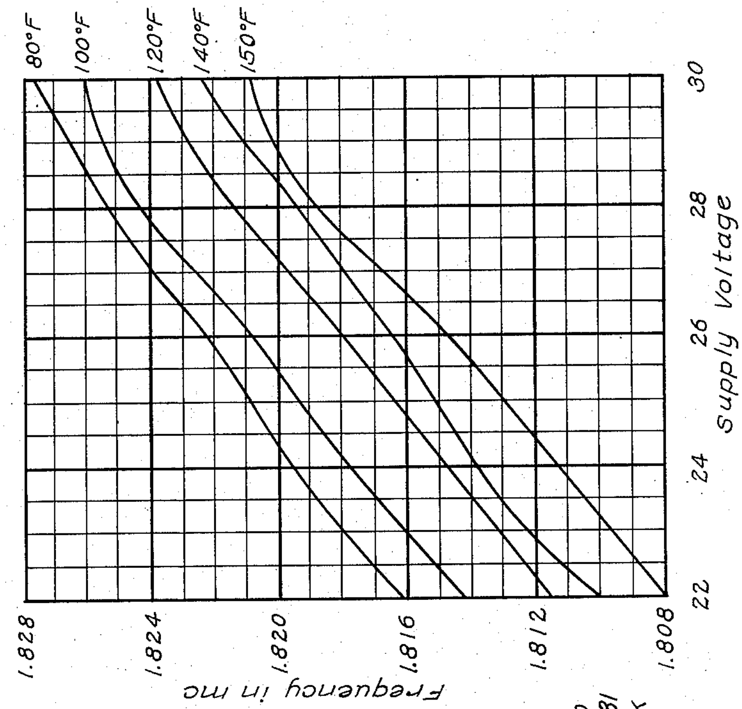
Figure 3 is a graph of variations of oscillator frequency versus transistor temperatures.

Variation of oscillator frequency with supply voltage, for various operating temperatures, is plotted in Figure 3 of the accompanying drawings, over a range of supply voltages.

As transistor temperature increases, the value of collector voltage V*c* tends to decrease because of increase of saturation current to the collector electrode. However, the diode 18 operates essentially as a voltage regulator tube, maintaining constant voltage across its own terminals, and thus maintaining constant the value of collector voltage V*c*.

Values of resistances 21 and 22 are selected to divide the total supply voltage change proportionately between V*c* and V*e*, for all values of supply voltage. Sufficiently good division occurs if the current flowing in resistance 21 is equal to total oscillator current or greater. It has been found that my invention may be practiced with separate emitter and collector voltage supplies, of either the battery or rectifier type, with consequent elimination of resistances 21 and 22 provided the separate supply voltage variations are and remain directly proportional to one another in magnitude.

Since resistances 13 and 15 are in series between terminal 16 and emitter electrode 2, resistance 15 may be combined with resistance 13 as a single resistor, necessitating some slight empirically-arrived-at adjustment of condenser 9 or resistance 17, to maintain a desired set of operating conditions, and a desired operating frequency.

The circuit of diode 18 may similarly be connected to tapped points of resistances 31, 15, rather than to their extreme terminals, if desired, without departing from the true scope of the invention as defined in the appended claims.

It has been experimentally determined that the principles and circuits of the present invention may be applied to oscillators employing junction transistors, providing the same frequency stability as can be obtained by regulation of both collector and emitter biases to ±3% for a ±15% supply voltage variation. The frequency stability of a conventional transistor oscillator may be increased, during supply voltage and temperature variations, by a factor of 20:1.

In operation, the voltage supply (not shown) provides positive voltage at terminal 19, which is connected via resistances 15 and 13 in series to emitter 2. The capacitor 14 is a by-pass to ground for oscillator frequency. Resistance 5 establishes a bias for base electrode 4 suitable to establish the conditions required for oscillations to be generated. Condenser 6 and inductance 7 provide an oscillator tank circuit, while condenser 9 provides feedback between the tank circuit and the emitter 2.

The negative supply terminal 20 is connected to the positive terminal 19 through series connected bleeder resistances 22, 21, the junction point of which is grounded, and terminal 20 is connected to collector electrode 3. The resistances 21, 22 are so selected as to divide the available supply voltage to provide values suitable for application to the transistor electrodes, and also so that total bleeder current is equal to or greater than total oscillator current. This provision assures that any variation of supply voltage will be proportionately distributed between emitter electrode 2 and collector electrode 3. Since the junction of the bleeder resistances is grounded, and the base electrode 4 is connected to ground for D. C., the collector electrode 3 is established at a negative potential and a voltage rise occurs in going toward terminal 20 through resistance 31.

The diode 18 is connected in inverse sense between terminal 19 and the higher potential terminal of resistance 31, and conducts in "zener" fashion in response to the applied voltage, commencing such conduction at the lowermost voltage value provided between terminals 19, 20. It is a characteristic of a diode conducting in the zener breakdown region that voltage across the diode remains substantially constant for all values of current. When the voltage supply rises in value the potential of terminal 20 with respect to ground increases negatively. In the absence of a compensating effect the voltage at collector 3 would increase accordingly, with consequent variation of oscillator voltage. However, the current flowing through diode 18 returns to terminal 20 via resistance 31, raising the voltage of collector 3 positively with respect to ground.

The total voltage compensation effected may be adjusted by varying resistance 17 or by changing the connection point of diode 18 to resistance 31. By suitable adjustments the value of bias voltage at collector electrode 3 may be caused to decrease when supply voltage increases, and vice versa, in such degree as to maintain constant the oscillator frequency.

Similarly, on change of temperature the collector saturation current of the oscillator varies, so that an increase in temperature tends to cause a decrease in collector bias voltage, with consequent variation of oscillator frequency. However, the diode tends to maintain constant collector voltage.

The use of a diode-resistance network, in accordance with the present invention, provides increased frequency stability for either voltage supply or for temperature variations, or both. Optimizing adjustments for either variation provides considerable improvement in respect to the other.

While I have described and illustrated a specific example of the present invention, it will be clear that variations of the specific details of construction may be resorted to without departing from the true spirit and scope of the present invention as defined in the appended claims.

What is claimed is:

1. A transistor oscillator comprising a transistor, said transistor having at least one emitter electrode, a collector electrode, and a base electrode, tuned circuit means connected to said electrodes in oscillation generating relation, voltage supply means for supplying bias voltages to said electrodes, said voltage supply means being variable in amplitude, and means for varying at least one of said bias voltages in such relation and amount relative to variations of amplitude of said supply voltage as to maintain constant the frequency of said oscillator, said last means comprising a diode operated in its zener discharge region.

2. A transistor oscillator, comprising a transistor having electrodes, circuitry connected to said electrodes, said circuitry arranged and adapted to cause said transistor to generate oscillations, voltage supply means for energizing said electrodes, said voltage supply means being variable in amplitude over a range of values and means for varying the voltage on at least one of said electrodes in inverse sense to variation of amplitude of said supply voltage and in response to said variation of amplitude of said supply voltage in amount arranged and adapted to maintain substantially constant the frequency of said transistor oscillator despite said variation of amplitude of said supply voltage.

3. A transistor circuit including a transistor having a collector electrode, an emitter electrode, and a base electrode, means for supplying bias voltages for application to said electrodes, said last means providing supply voltages variable in amplitude, and means for varying the bias applied to at least one of said electrodes in inverse sense to variation of amplitude of said supply voltages, said last means including a diode rectifier operating in its zener discharge region, and means connecting said diode rectifier in shunt to said means providing supply voltages.

4. A transistor circuit including a transistor having an emitter electrode, a collector electrode, a base electrode, a direct current voltage supply source having two terminals, means connecting said base electrode to a point of reference potential, a resistance type voltage divider connected between said terminals, means connecting an intermediate point of said voltage divider to said point of reference potential, said direct current voltage supply providing a direct current voltage of variable amplitude, said voltage divider arranged and adapted to divide variations in said direct current voltage supply substantially proportionally between said emitter electrode and said collector electrode.

5. The combination in accordance with claim 4, wherein is further provided a resistance in series between one of said terminals and one of said electrodes, and a diode rectifier circuit connected in shunt between the other of said terminals and said one of said electrodes, said divider rectifier circuit including a semiconductor diode operating in its zener discharge region.

6. The combination in accordance with claim 4, wherein is further provided a resistance in series between one of said terminals and one of said electrodes, and a voltage regulator device connected in shunt between the other of said terminals and a point of said last named resistance.

7. A transistor oscillator circuit providing compensation for variation of oscillator supply voltage on oscillator frequency, said transistor having a collector, comprising means for varying the bias at said collector in inverse sense to variation of said supply voltage, comprising a supply voltage terminal, a resistance connected between said voltage terminal and said collector, and means for providing a voltage drop across said resistance which varies with supply voltage in such sense as to reduce said bias at said collector in response to rise of supply voltage, said last means including a diode-resistance circuit connected in series with said resistance, said diode consisting of a semiconductor rectifier operating in its zener discharge region.

8. A transistor oscillator circuit providing compensation for variation of transistor temperature on operating parameters of said transistor oscillator circuit, said transistor having a collector, comprising means for maintaining constant voltage at said collector during variation of collector saturation current in response to variation of transistor temperature, said last means including a semiconductor diode circuit, said diode operating in its zener discharge region, a source of voltage supply for said collector, and means for connecting said diode circuit intermediate said voltage supply and said collector.

9. The combination of first and second series connected resistors having end terminals and a common junction, a supply voltage source connected across said end terminals, and a series network connected between said end terminals comprising, in the order named, a third resistor, a zener diode, and a fourth resistor, the diode and the fourth resistor being connected to a second junction, the potential difference between said junction points being constant during conduction of said diode.

References Cited in the file of this patent

UNITED STATES PATENTS

| | | |
|---|---|---|
| 2,693,572 | Chase | Nov. 2, 1954 |
| 2,716,729 | Shockley | Aug. 30, 1955 |

OTHER REFERENCES

"Transistor Oscillators for Telemetering," by Lehan; pages 90–91 of Electronics for August 1949.

"Transistor Circuitry," by Clay; pages 35–39 of Q. S. T. for December 1953.